(12) United States Patent
Kim

(10) Patent No.: US 8,018,071 B2
(45) Date of Patent: Sep. 13, 2011

(54) STACKED STRUCTURE USING SEMICONDUCTOR DEVICES AND SEMICONDUCTOR DEVICE PACKAGE INCLUDING THE SAME

(75) Inventor: Kil-Soo Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 689 days.

(21) Appl. No.: 12/027,480

(22) Filed: Feb. 7, 2008

(65) Prior Publication Data

US 2008/0185732 A1 Aug. 7, 2008

(30) Foreign Application Priority Data

Feb. 7, 2007 (KR) .................. 10-2007-0012824
Jun. 11, 2007 (KR) .................. 10-2007-0056851

(51) Int. Cl.
*H01L 23/48* (2006.01)
(52) U.S. Cl. ................. 257/777; 257/E23.02
(58) Field of Classification Search .......... 257/777–781, 257/784, 786, E23.02, 686
See application file for complete search history.

(56) References Cited

U.S. PATENT DOCUMENTS

| 6,448,661 | B1 | 9/2002 | Kim et al. |
| 6,649,428 | B2 | 11/2003 | Kai |
| 6,791,175 | B2 | 9/2004 | Matsuo et al. |
| 7,102,238 | B2 | 9/2006 | Noma et al. |
| 2002/0074654 | A1 * | 6/2002 | Koriyama .................. 257/728 |

FOREIGN PATENT DOCUMENTS

| JP | 2001-135779 | 5/2001 |
| JP | 2003-060053 | 2/2003 |
| JP | 2003-110086 | 4/2003 |
| JP | 2004-343088 | 12/2004 |
| KR | 2002-0024624 | 4/2002 |
| KR | 1020020066095 A | 8/2002 |
| KR | 1020030014100 A | 2/2003 |
| KR | 1020030028412 A | 4/2003 |
| KR | 10-2004-0092435 | 11/2004 |
| KR | 10-2006-0047302 | 5/2006 |

OTHER PUBLICATIONS

English language abstract of Japanese Publication No. 2001-135779.
English language abstract of Korean Publication No. 2002-0024624.
English language abstract of Korean Publication No. 10-2004-0092435.
English language abstract of Japanese Publication No. 2004-343088.

* cited by examiner

*Primary Examiner* — Hoa B Trinh
(74) *Attorney, Agent, or Firm* — Myers Bigel Sibley & Sajovec, P.A.

(57) ABSTRACT

This invention provides a semiconductor device. The semiconductor device includes a bonding pad array comprising: a signal bonding pad, a control pin bonding pad and at least one stacking bonding pad on an active surface. At least one stacking bonding pad is adjacent to the control pin bonding pad. This invention also provides a stacked structure of semiconductor devices and/or a semiconductor device package including the semiconductor device.

15 Claims, 13 Drawing Sheets

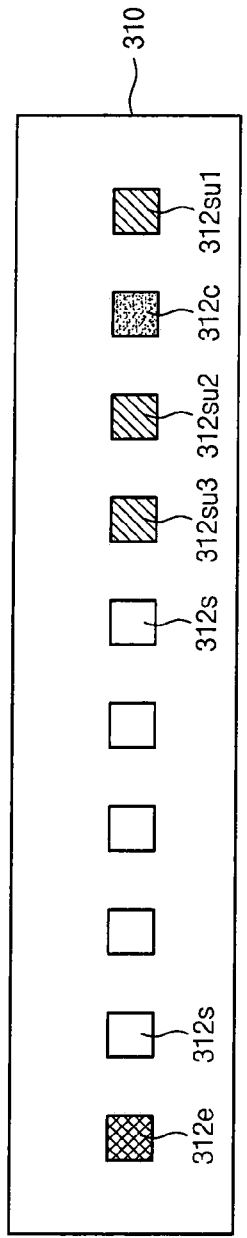
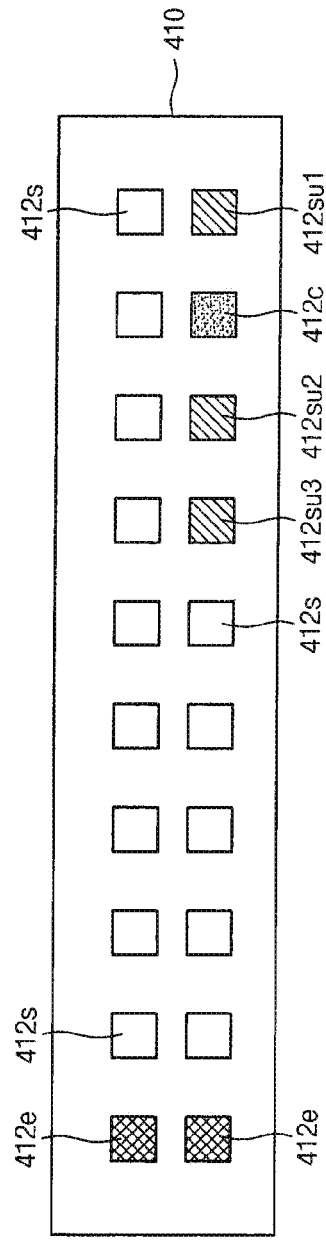

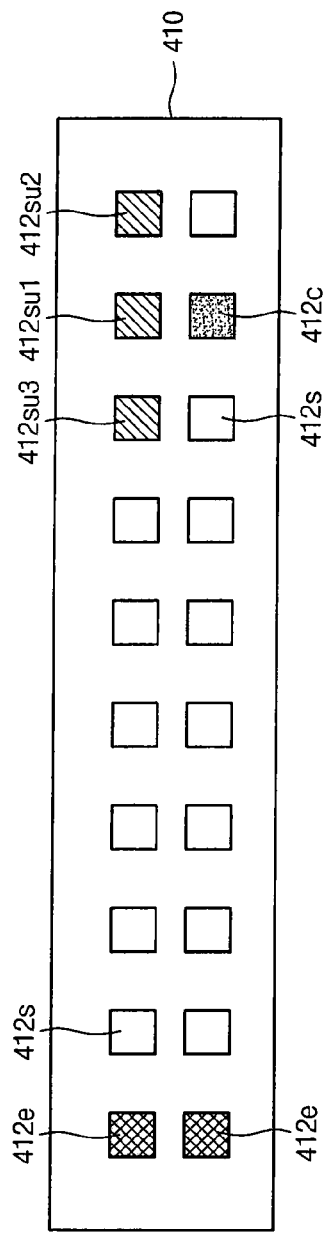
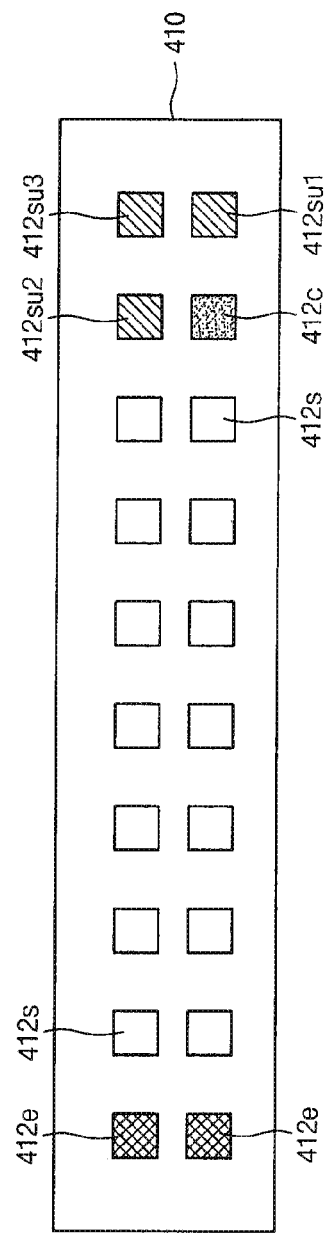

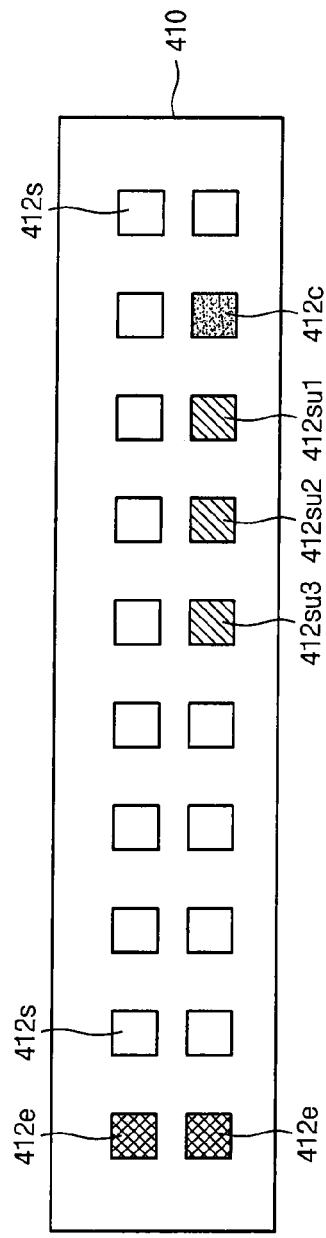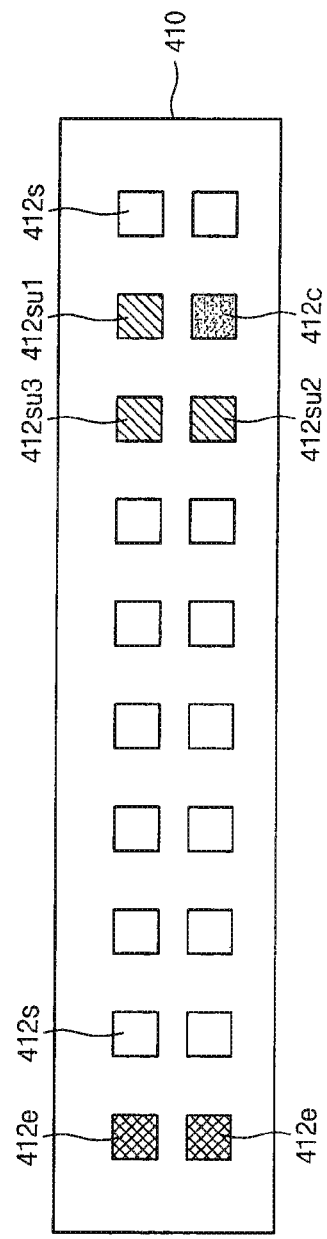

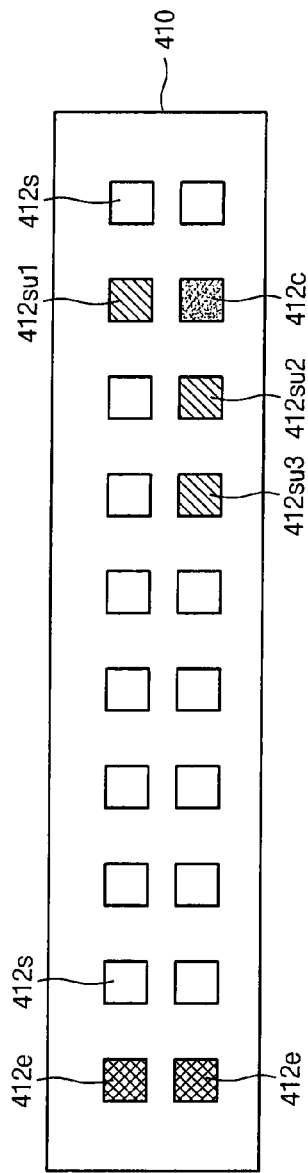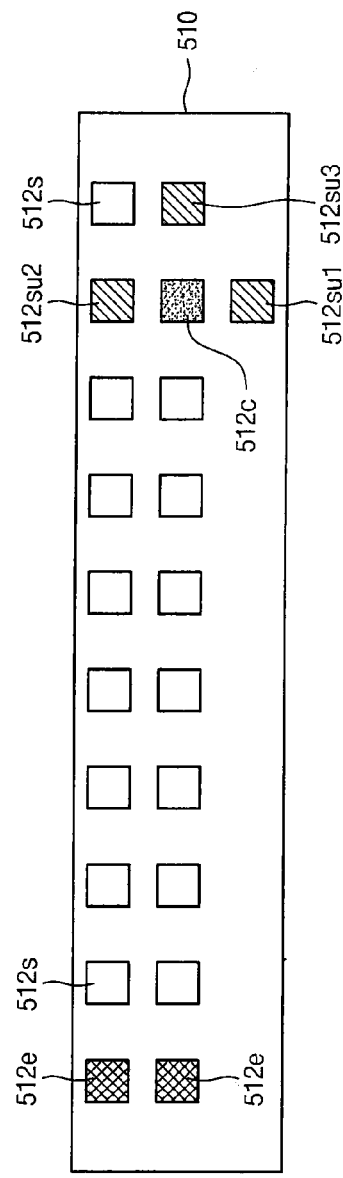

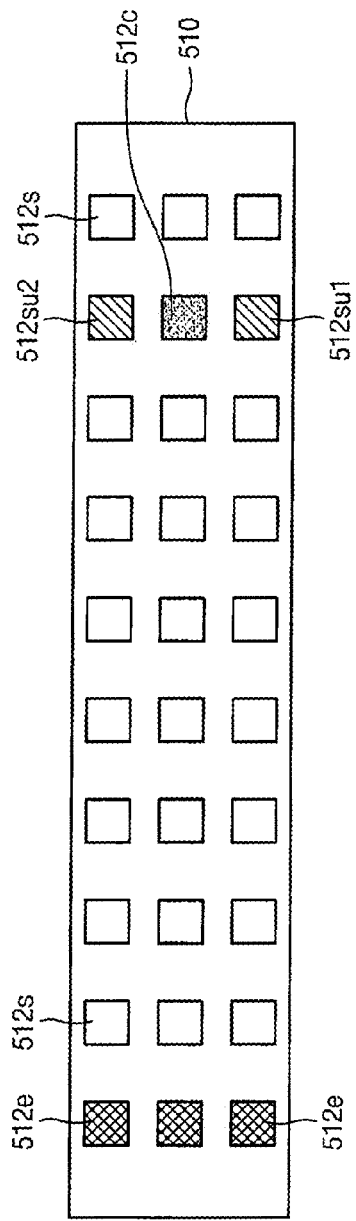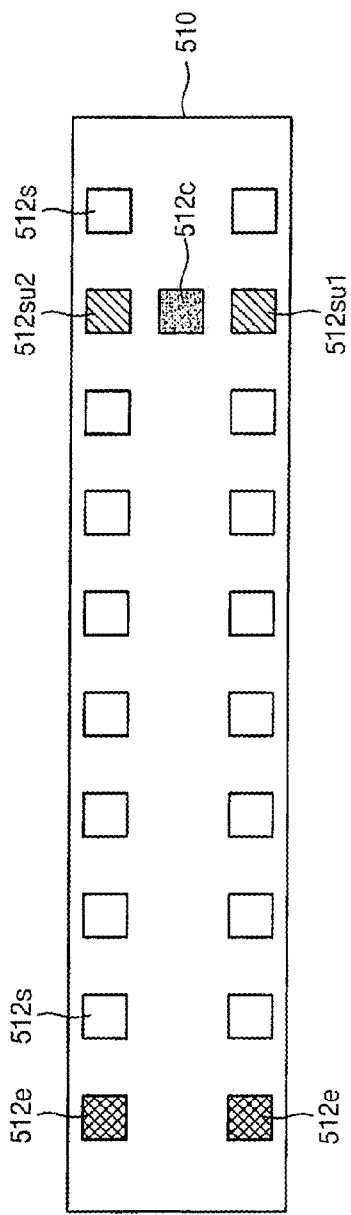

US 8,018,071 B2

STACKED STRUCTURE USING SEMICONDUCTOR DEVICES AND SEMICONDUCTOR DEVICE PACKAGE INCLUDING THE SAME

CROSS-REFERENCE TO RELATED APPLICATIONS

This U.S. non-provisional patent application claims priority under 35 U.S.C. §119 to Korean Patent Application Nos. 10-2007-12824 and 10-2007-56851, filed on Feb. 7, 2007 and Jun. 11, 2007, respectively, the entire contents of which are hereby incorporated by reference.

BACKGROUND

1. Technical Field

The present invention relates to semiconductor devices and semiconductor device packages, and more specifically, to a bonding pad array of a semiconductor device and a semiconductor device package including the same.

2. Description of the Related Art

Integrated circuit (IC) packaging technology in the semiconductor industry continues to develop in order to meet the demand for scaling down of size and improved mounting reliability. For example, demand for miniaturization has accelerated technology development of packages close to the size of a semiconductor chip. Also, demand for greater mounting reliability has driven development in packaging technology that can improve the efficiency of the mounting process, and mechanical and electrical reliability after the mounting process.

Also, various technologies for producing high capacity semiconductor products are being researched and developed, as miniaturization and a high degree of integration continue to be required. Methods for providing high capacity semiconductor products include increasing the storage capacity of the memory chip, i.e., a high degree of integration of the memory chip. Such high integration of the memory chip can be realized by integrating a higher number of memory cells in the limited space of a semiconductor chip.

However developing such high integration of the memory chip takes significant time and requires advanced technology, such as process precision and extra-fine line widths. Accordingly, a method of vertically stacking a plurality of semiconductor chips or semiconductor device packages has been proposed. Such a stacking method produces an advantage in mounting density and in mounting area use efficiency as well as an increase in memory storage capacity. Therefore research and development in stack-structured semiconductor device packages continues.

FIG. 1A and FIG. 1B are a sectional view and a top plan view of a conventional semiconductor device package, respectively.

Referring to FIGS. 1A and 1B, a semiconductor device package includes first and second semiconductor devices 10a and 10b and a wiring substrate 20.

The first and second semiconductor devices 10a and 10b include a control pin bonding pad 12ac and 12bc, at least one electrical die sorting (EDS) bonding pad 12ae and 12be, and a plurality of signal bonding pads 12as and 12bs, the bonding pads disposed on the respective active surfaces of the first and second semiconductor devices 10a and 10b. Each of the bonding pads is configured to be connected to penetrating electrodes which penetrate the first and second semiconductor devices 10a and 10b.

The EDS bonding pad 12ae of the first semiconductor device 10a and the EDS bonding pad 12be of the second semiconductor device 10b are electrically connected. The signal bonding pads 12as of the first semiconductor device 10a and the signal bonding pads 12bs of the second semiconductor device 10b are electrically connected. Such electrical connections are made by connection electrodes 16 included in an adhesive material layer 15 provided between the first and second semiconductor devices 10a and 10b. The control pin bonding pad 12ac of the first semiconductor device 10a and the control pin bonding pad 12bc of the second semiconductor device 10b are not electrically connected.

The wiring substrate 20 may include a system board such as a printed circuit board (PCB). The wiring substrate 20 having a core material 22 as the body, includes an upper surface insulation layer pattern 24u including upper bonding electrodes 26u, and a lower surface insulation layer pattern 24l opposite of the upper surface insulation layer pattern 24u, the lower surface insulation layer pattern 24l including lower bonding electrodes 26l.

The wiring substrate 20 has the upper bonding electrodes 26u which correspond to the bonding pads 12ac, 12ae and 12as of the first semiconductor device 10a, the upper bonding electrodes 26u disposed on the upper surface of the wiring substrate 20. The upper bonding electrodes 26u are electrically connected to their corresponding bonding pads 12ac, 12ae and 12as of the first semiconductor device 10a. The first and second semiconductor devices 10a and 10b are vertically stacked and mounted on the wiring substrate 20 with a mounting adhesive material layer (not shown).

The wiring substrate 20 has the lower bonding electrodes 26l for forming solder balls 28s on the lower surface. The solder balls 28s provided on the lower surface of the wiring substrate 20 are connected to internal interconnections (bent solid lines) to provide electrical connections between the stacked first and second semiconductor devices 10a and 10b and external circuits. Signal solder balls A0, A1 and A2 are connected to the signal bonding pads 12as of the first semiconductor device 10s by the internal interconnections of the wiring substrate 20. Control solder balls ct10 and ct11 are respectively connected to the control pin bonding pad 12ac and the EDS bonding pad 12ae of the first semiconductor device 10a by the internal interconnections of the wiring substrate 20.

The semiconductor device package including the stacked first and second semiconductor devices 10a and 10b controls each of the semiconductor devices 10a and 10b so as to selectively operate the semiconductor devices 10a and 10b. While the first semiconductor device 10a is able to receive an operation signal directly through the control pin bonding pad 12ae, an additional connection line 13sl connecting the control pin bonding pad 12bc and the EDS bonding pad 12be is required in order for the second semiconductor device 10b to be able to receive an operation signal.

A semiconductor device package having the above-explained structure can control the operation of stacked semiconductor devices by using an electrical die sorting bonding pad. However there is a large difference between the physical lengths of the interconnections used as the paths receiving an operation signal in the stacked semiconductor devices. Thus, there is a problem of signal delay that may occur because of the difference in physical lengths of the interconnections used in the stacked semiconductor devices.

SUMMARY

Exemplary embodiments of the present invention are directed to a stacked structure using semiconductor devices and a semiconductor device package including the same. In an exemplary embodiment, a semiconductor device may include a bonding pad array comprising: a signal bonding pad provided on an active surface; a control pin bonding pad provided on the active surface; and at least one stacking bonding pad provided on the active surface, wherein the at least one stacking bonding pad is adjacent to the control pin bonding pad.

BRIEF DESCRIPTION OF THE DRAWINGS

FIG. 5 is a plan view of a bonding pad array of a semiconductor device according to an exemplary embodiment of the present invention.

FIGS. 6A to 6F are plan views of other bonding pad arrays of a semiconductor device according to exemplary embodiments of the present invention.

FIGS. 7A to 7C are plan views of still other bonding pad arrays of a semiconductor device according to exemplary embodiments of the present invention.

DETAILED DESCRIPTION

Figure 1A:
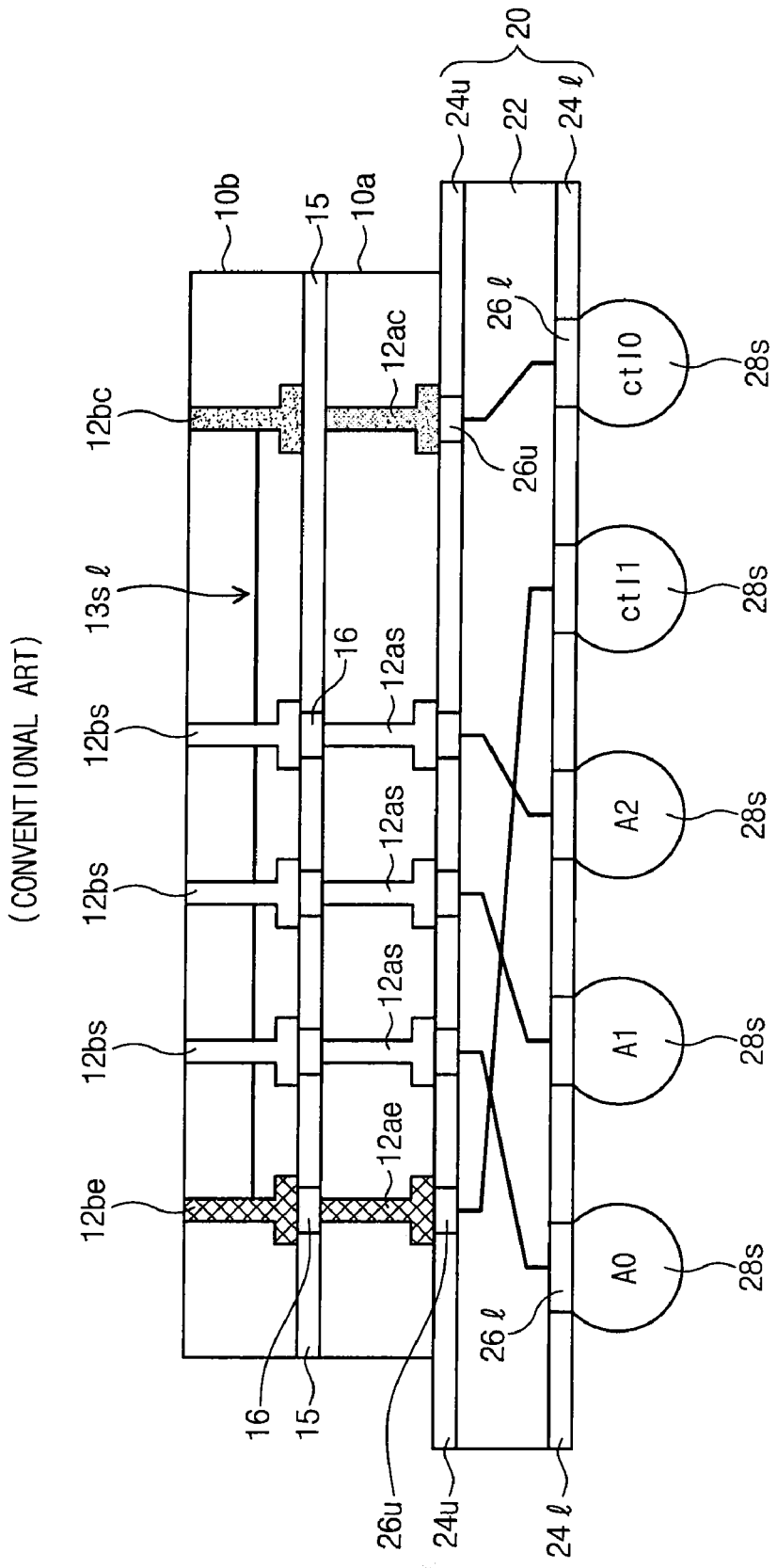
FIG. 1A and FIG. 1B are a sectional view and a top plan view of a conventional semiconductor device package, respectively.
Figure 1B:
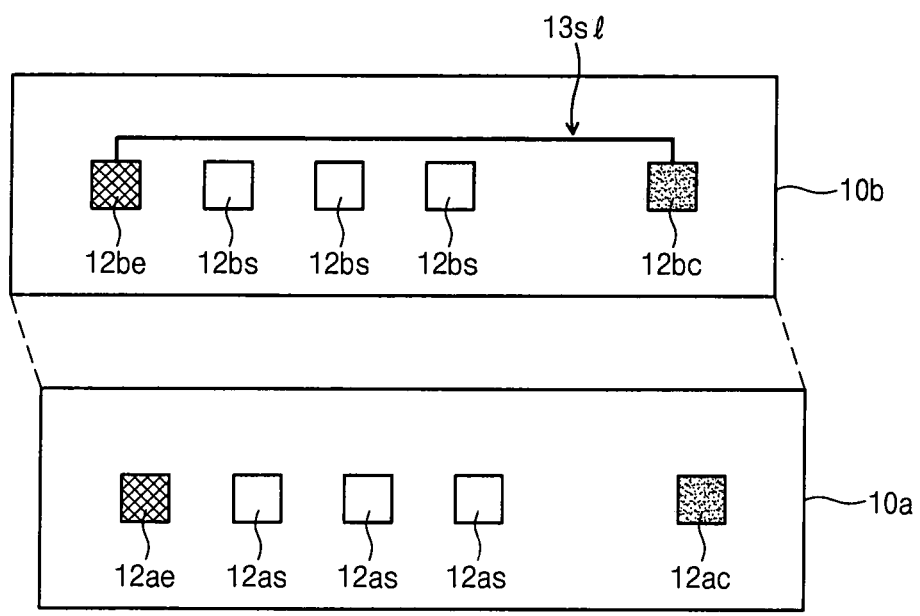

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numbers refer to like elements throughout.

Figure 2A:
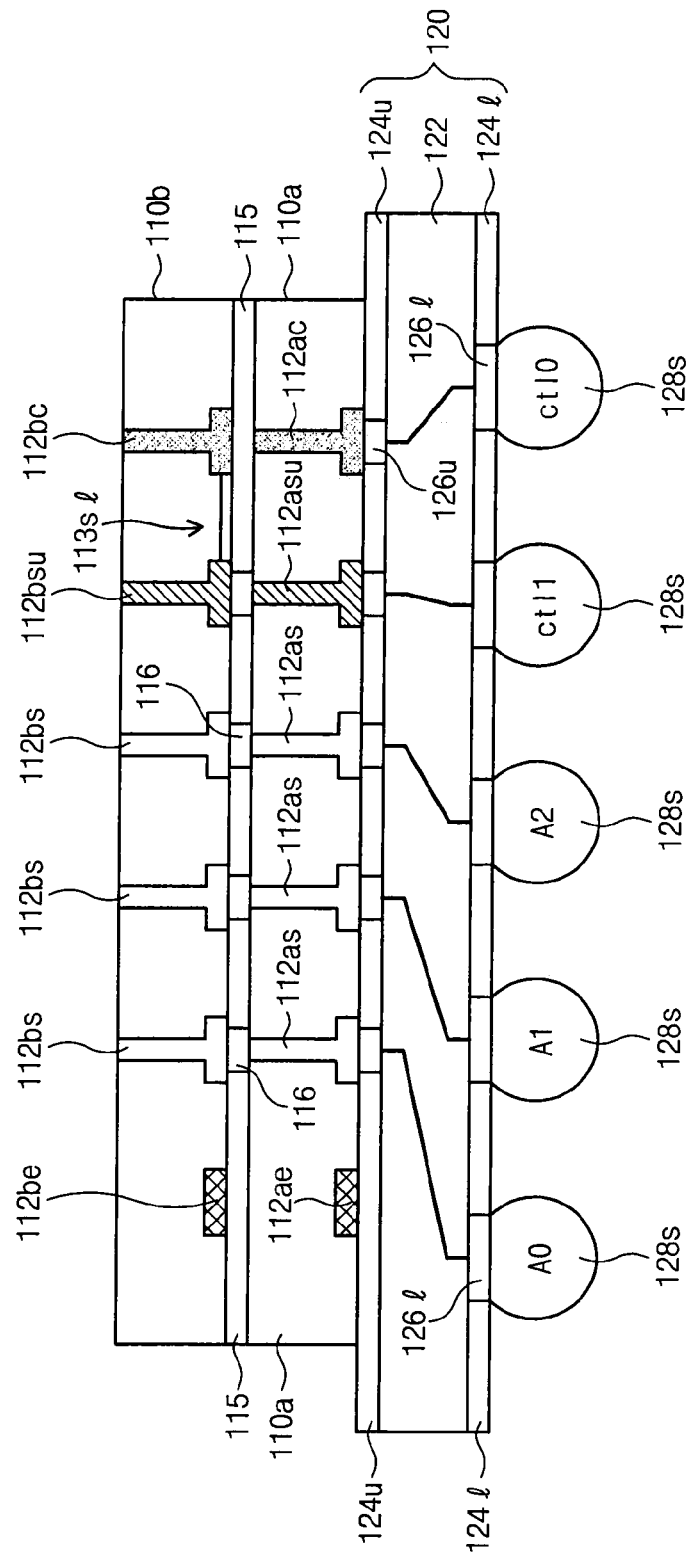
FIG. 2A and FIG. 2B are a sectional view and a top plan view of a semiconductor device package according to an exemplary embodiment of the present invention.
Figure 2B:
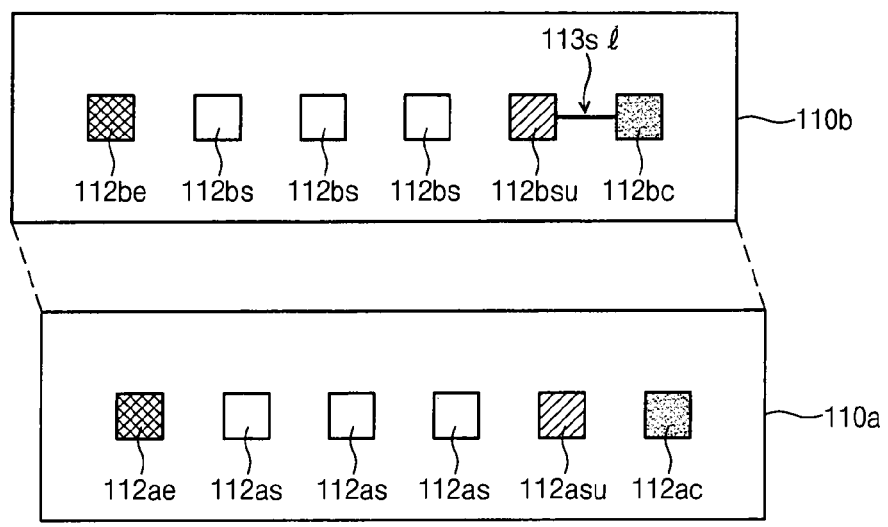

FIG. 2A and FIG. 2B are a sectional view and a top plan view of a semiconductor device package according to an exemplary embodiment of the present invention.

Referring to FIGS. 2A and 2B, a semiconductor device package may include first and second semiconductor devices 110a and 110b stacked vertically and a wiring substrate 120.

The first semiconductor device 110a may include a control pin bonding pad 112ac, at least one electrical die sorting (EDS) bonding pad 112ae, signal bonding pads 112as and a stacking bonding pad 112asu, the bonding pads disposed on an active surface of the first semiconductor device 110a. The second semiconductor device 110b, as does the first semiconductor device 110a, may include a control pin bonding pad 112bc, at least one EDS bonding pad 112be, signal bonding pads 112bs and a stacking bonding pad 112bsu, the bonding pads disposed on an active surface of the second semiconductor device 110b. The first semiconductor device 110a may be configured to have a bonding pad array in which at least one stacking bonding pad 112asu is disposed adjacent to the control pin bonding pad 112ac. The second semiconductor device 110b, as is the first semiconductor device 110a, may be configured to have a bonding pad array in which at least one stacking bonding pad 112bsu is disposed adjacent to the control pin bonding pad 112bc. In other words, each of the first and second semiconductor devices 110a and 110b may be configured to have the bonding pad array in which at least one of the stacking bonding pads 112asu or 112bsu is disposed adjacent to the control pin bonding pads 112ac and 112bc.

The signal bonding pads 112as and 112bs may be arrayed in a plurality of rows, and the number of the EDS bonding pads 112ae and 112be may be equal to the number of the rows of the signal bonding pads 112as and 112bs. The EDS bonding pads 112ae and 112be may be used for inspecting electrical characteristics of the first and second semiconductor devices 110a and 110b. As there is one row of signal bonding pads 112as and 112bs, there may be one of the EDS bonding pads 112ae and 112be. If there are n stacked semiconductor devices (n is two or a larger positive integer), the number of the stacking bonding pads on each of the semiconductor devices may be n−1. As there are two stacked semiconductor devices 110a and 110b shown in FIGS. 2A and 2B, there may be one stacking bonding pad 112asu and 112bsu on each of the semiconductor devices 110a and 110b. The EDS bonding pads 112ae and 112be may be used in place of the stacking bonding pads 112asu and 112bsu. In this case, the EDS bonding pads 112ae and 112be are formed adjacent to the control pin bonding pads 112ac and 112bc so that the EDS bonding pads 112ae and 112be may serve as the stacking bonding pads 12asu and 112bsu.

Each of the bonding pads may be configured to be connected to penetrating electrodes, the penetrating electrodes penetrating the first and second semiconductor devices 110a and 110b. Each of the bonding pads and penetrating electrodes connected to each of the bonding pads may be configured to protrude from the surfaces of the first and second semiconductor devices 110a and 110b. The bonding pads not electrically connected between the stacked first and second semiconductor devices 110a and 110b, for example, the EDS bonding pads 112ae and 112be or the control pin bonding pads 112ac and 112bc, may not be connected to the penetrating electrodes. Although not shown, in the case that there are two stacked semiconductor devices 110a and 110b, all of the bonding pads 112bc, 112be, 112bs and 112bsu of the second semiconductor device 110b may be pad type bonding pads that are not connected to penetrating electrodes.

The signal bonding pads 112as of the first semiconductor device 110a and the signal bonding pads 112bs of the second semiconductor device 110b may be electrically connected along the stacked direction. Such electrical connections may be made by the connecting electrodes 116 included in the adhesive material layer 115 provided between the first and second semiconductor devices 110a and 110b. Alternatively, the bonding pads and the penetrating electrodes connected to the bonding pads can be protruded from the first and second semiconductor devices 110a and 110b. In this case, such electrical connections may be made by the adhesive material layer 115 made of an anisotropic conductive film (ACF), between the first and second semiconductor devices 110a and 110b. The EDS bonding pad 112ae of the first semiconductor device 110a and the EDS bonding pad 12be of the semiconductor device 110b are not electrically connected.

The wiring substrate 120 may include a system substrate such as a printed circuit board (PCB). The wiring substrate 120 having a core material 122 as the body, may have an upper surface insulation layer pattern 124u including upper bonding electrodes 126u and a lower surface insulation layer pattern 124l opposite of the upper surface insulation layer pattern 124u, the lower insulation layer pattern 124l including the lower bonding electrodes 126l. In other words, the lower surface insulation layer pattern 124l may be disposed on an opposite surface of the wiring substrate 120 from the upper surface insulation layer pattern 124u.

The wiring substrate 120 may have the upper bonding electrodes 126u corresponding to the bonding pads 112ac, 112as and 112asu, except for the EDS bonding pad 112ae of the first semiconductor device 110a. The upper bonding electrodes 126u may be electrically connected to their corresponding bonding pads 112ac, 112as and 112asu of the first semiconductor device 110a. The stacked first and second semiconductor devices 110a and 110b may be mounted on the wiring substrate 120 with a mounting adhesive material layer (not shown) so as to be electrically connected to each other. The mounting adhesive material layer may be made of an anisotropic conductive film. Alternatively, the mounting adhesive material layer may include the connecting electrodes (similar to 116 of FIG. 2A) provided for electrical connection between the stacked first and second semiconductor devices 110a and 110b, and the wiring substrate 120.

The wiring substrate 120 may have lower bonding electrodes 126l for forming solder balls 128s on the lower surface. The solder balls 128s provided on the lower surface of the wiring substrate 120 are connected to the internal interconnections (bent solid lines) of the wiring substrate 120. These connections provide electrical connections of the stacked first and second semiconductor devices 110a and 110b to external circuits. Signal solder balls A0, A1 and A2 may be connected to the signal bonding pads 112as of the first semiconductor device 110a by the internal interconnections. Control solder balls ct10 and ct11 may be respectively connected to the control pin bonding pad 112ac and the stacking bonding pad 112asu of the first semiconductor device 110a by the internal interconnections of the wiring substrate 120.

The semiconductor device package including the stacked first and second semiconductor devices 110a and 110b may control each of the semiconductor devices 110a and 110b to selectively operate the first and second semiconductor devices 110a and 110b. The control pin bonding pad 112ac of the first semiconductor device 110a receives the operation signal directly. The second semiconductor device 110b receives the signal indirectly by an additional connection line 113sl which connects the short distance between the stacking bonding pad 112bsu adjacent to the control pin bonding pad 112bc.

The first and second semiconductor devices 110a and 110b have the bonding pad array in which at least one stacking bonding pad 112asu and 112bsu is adjacent to the control pin bonding pads 112ac and 112bc. Therefore, unlike conventional methods, the physical length difference of the interconnections between the stacked first and second semiconductor devices 110a and 110b may be minimized. The interconnections are used as the paths that receive operation signal controlling operations of the stacked first and second semiconductor devices 110a and 110b. Therefore, the signal delay resulting from the signal time difference between the stacked first and second semiconductor devices 110a and 110b may be minimized.

Figure 3A:
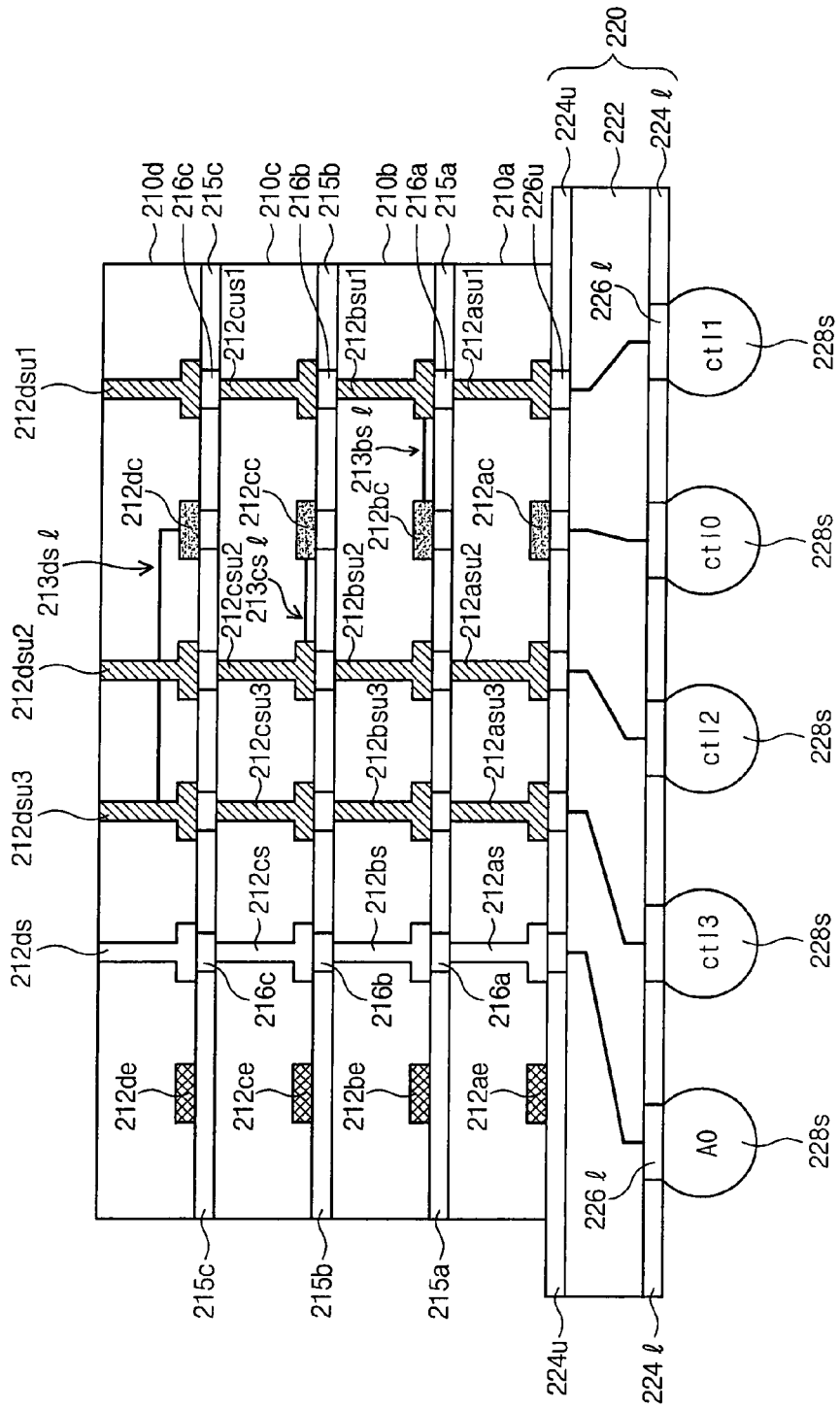
FIG. 3A and FIG. 3B are a sectional view and a top plan view of a semiconductor device package according to another exemplary embodiment of the present invention.
Figure 3B:
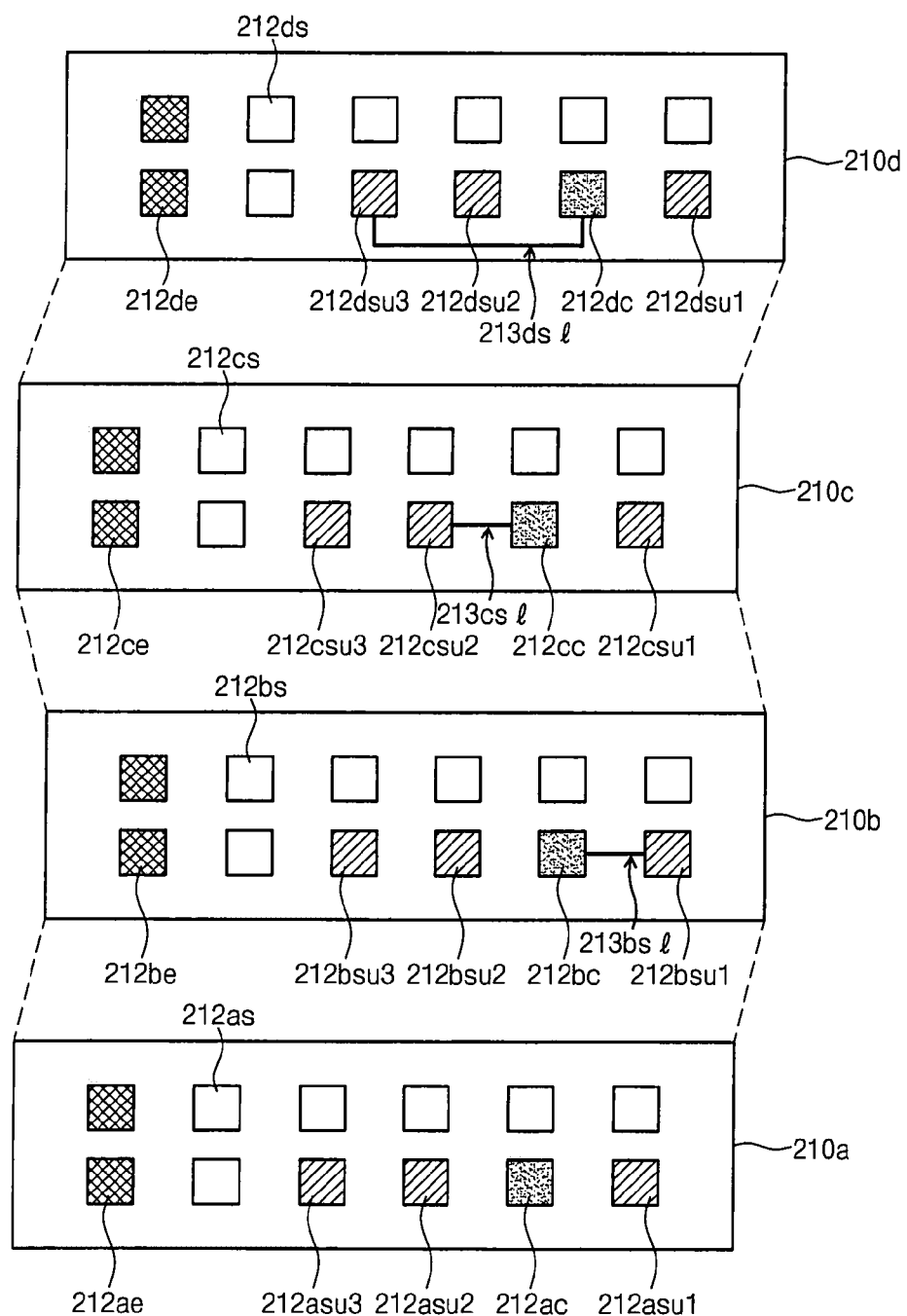

FIG. 3A and FIG. 3B are a sectional view and a top plan view of a semiconductor device package according to another exemplary embodiment of the present invention.

Referring to FIGS. 3A and 3B, a semiconductor device package may include stacked first second, third and fourth semiconductor devices 210a, 210b, 201c and 210d, respectively, and a wiring substrate 220.

The first, second, third and fourth semiconductor devices 210a, 210b, 201c and 210d may include on their respective active surfaces a control pin bonding pad 212ac, 212bc, 212cc and 212dc, at least one electrical die sorting (EDS) bonding pad 212ae, 212be, 212ce and 212de, a plurality of signal bonding pads 212as, 212bs, 212cs and 112ds, and a plurality of stacking bonding pads 212asu1, 212asu2, 212asu3, 212bsu1, 212bsu2, 212bsu3, 212csu1, 212csu2, 212csu3, $212_{dsu}1$, $212_{dsu}2$ and $212_{dsu}3$. The first, second, third and fourth semiconductor devices 210a, 210b, 201c and 210d may each have a bonding pad array in which stacking bonding pads 212asu1, 212asu2, 212bsu1, 212bsu2, 212csu1, 212csu2, 212dsu1 and 112dsu2 are adjacent to the respective control pin bonding pads 212ac, 212bc, 212cc and 212dc.

The signal bonding pads 212as, 212bs, 212cs and 212ds may be arrayed in a plurality of rows. The number of the EDS bonding pads 212ae, 212be, 212ce and 212de may be equal to the number of the rows of the signal bonding pads 212as, 212bs, 212cs and 212ds. As there are two rows of the signal bonding pads 212as, 212bs, 212cs and 212ds shown in FIGS. 3A and 3B, there may be two EDS bonding pads 212ae, 212be, 212ce and 212de. If n stacked semiconductor devices (n is two or a larger positive integer), the number of the stacking bonding pads on each of the stacked semiconductor devices may be n−1. As there are four stacked semiconductor devices 210a, 210b, 210c and 210d shown in FIGS. 3A and 3B, the number of the stacking bonding pads 212asu1, 212asu2, 212asu3, 212bsu1, 212bsu2, 212bsu3, 212csu1, 212csu2, 212csu3, 212dsu1, 212dsu2 and 212dsu3 on each of the stacked semiconductor devices 210a, 210b, 210c and 210d may be three. According to some embodiments, the EDS bonding pads 212ae, 212be, 212ce and 212de may be used in place of the stacking bonding pads 212asu1, 212asu2, 212asu3, 212bsu1, 212bsu2, 212bsu3, 212csu1, 212csu2, 212csu3, 212dsu1, 212dsu2 and 212dsu3. In other words, by forming the EDS bonding pads 212ae, 212be, 212ce and 212de adjacent to the control pin bonding pads 212ac, 212bc, 212cc and 212dc, the EDS bonding pads 212ae, 212be, 212ce and 212de may serve as the stacking bonding pads 212asu1, 212asu2, 212asu3, 212bsu1, 212bsu2, 212bsu3, 212csu1, 212csu2, 212csu3, 212dsu1, 212dsu2 and 212dsu3.

Each of the bonding pads may be configured to be connected to penetrating electrodes penetrating the first, second, third and fourth semiconductor devices 210a, 210b, 210c and 210d. Each of the bonding pads and the penetrating electrodes connected to each of the bonding pads may be configured to protrude from the surfaces of the first, second, third and fourth semiconductor devices 210a, 210b, 210c and 210d. The bonding pads not electrically connected between the stacked first, second, third and fourth semiconductor devices 210a, 210b, 210c and 210d, for example, the EDS bonding pads 212ae, 212be, 212ce and 212de or the control pin bonding pads 212ac, 212bc, 212cc and 212dc, may not be connected to the penetrating electrodes. Although not shown, in the case where there are four stacked semiconductor devices 210a, 210b, 210c and 210d, all of the bonding pads 212dc, 212de, 212ds, 212dsu1, 212dsu2 and 212dsu3 of the fourth semiconductor device 210d may be configured not to be connected to the penetrating electrodes.

The signal bonding pads 212as, 212bs, 212cs and 212ds and the stacking bonding pads 212asu1, 212asu2, 212asu3, 212bsu1, 212bsu2, 212bsu3, 212csu1, 212csu2, 212csu3, 212dsu1, 212dsu2 and 212dsu3 may be electrically connected respectively between the stacked first, second, third and fourth semiconductor devices 210a, 210b, 210c and 210d. If required, the stacking bonding pads 212asu1, 212asu2, 212asu3, 212bsu1, 212bsu2, 212bsu3, 212csu1, 212csu2, 212csu3, 212dsu1, 212dsu2 and 212dsu3 connected to each of the control pin bonding pads 212ac, 212bc, 212cc and 212dc, may not be configured to be connected to the penetrating electrodes. Such electrical connections may be made by connecting electrodes 216a, 216b and 216c each included in the adhesive material layers 215a, 215b and 215c provided between the first, second, third and fourth semiconductor devices 210a, 210b, 210c and 210d respectively. Alternatively, if the bonding pads and the penetrating electrodes connected to the bonding pads are protruded from the surfaces of the first, second, third and fourth semiconductor devices 210a, 210b, 210c and 210d, such electrical connections may be made by the adhesive material layers 215a, 215b and 215c made of an anisotropic conductive film (ACF). The control pin bonding pads 212ac, 212bc, 212cc and 212dc and the EDS bonding pads 212ae, 212be, 212ce and 212de, disposed between the stacked first, second, third and fourth semiconductor devices 210a, 210b, 210c and 210d, are not electrically connected to each other.

The wiring substrate 220 may include a system substrate such as a printed circuit board (PCB). The wiring substrate 220 having a core material 222 as the body, may have an upper surface insulation layer pattern 224u including upper bonding electrodes 226u, and a lower surface insulation layer pattern 224l opposite of the upper surface insulation layer pattern 224u, the lower surface insulation layer pattern 224l including lower bonding electrodes 226l.

The wiring substrate 220 has the upper bonding electrodes 226u which correspond to the bonding pads 212ac, 212as, 212asu1, 212asu2 and 212asu3, except for the EDS bonding pad 212ae of the first semiconductor device 210a, the upper bonding electrodes 226u disposed on the upper surface of the wiring substrate 220. The upper bonding electrodes 226u may be electrically connected to their corresponding bonding pads 212ac, 212as, 212asu1, 212asu2 and 212asu3 of the first semiconductor device 210a. The stacked first, second, third and fourth semiconductor devices 210a, 210b, 210c and 210d may be mounted on the wiring substrate 220 by a mounting adhesive material layer (not shown) so as to be electrically connected. The mounting adhesive material layer may be made of an anisotropic conductive film. Alternatively, the mounting adhesive material layer may include the connecting electrodes (similar to 216a, 216b and 216c of FIG. 3A) provided for electrical connection between the stacked first, second, third and fourth semiconductor devices 210a, 210b, 210c and 210d, and the wiring substrate 220.

The wiring substrate 220 may have the lower bonding electrodes 226l for forming solder balls 228s, the lower bonding electrodes 226l disposed on the lower surface of the wiring substrate 220. The solder balls 228s provided on the lower surface of the wiring substrate 220 are connected to the internal interconnections (bent solid lines) of the wiring substrate 220 to provide electrical connections of the stacked first, second, third and fourth semiconductor devices 210a, 210b, 210c and 210d to external circuits. A signal solder ball A0 may be connected to the signal bonding pad 212as of the first semiconductor device 210a by the internal interconnections of the wiring substrate 220. Controlling solder balls ct10, ct11, ct12 and ct13 may be connected to the control pin bonding pad 212ac and the stacking bonding pads 212asu1, 212asu2 and 212asu3 of the first semiconductor device 210a, respectively, by the internal interconnections of the wiring substrate 220.

The semiconductor device package including the stacked first, second, third and fourth semiconductor devices 210a, 210b, 210c and 210d may control each of the semiconductor devices 210a, 210b, 210c and 210d so as to selectively operate each of the stacked first, second, third and fourth semiconductor devices 210a, 210b, 210c and 210d. The control pin bonding pad 212ac of the first semiconductor device 210a receives the operation signal directly. The second semiconductor device 210b receives the operation signal indirectly by an additional connection line 213bsl which connects the short distance between the stacking bonding pad 212bsu1 adjacent to the control pin bonding pad 212bc. The third semiconductor device 210c also receives the operation signal indirectly by an additional connection line 213csl which connects the short distance between the stacking bonding pad 212csu2 adjacent to the control pin bonding pad 212cc. The fourth semiconductor device 210d also receives the operation signal indirectly by an additional connection line 213dsl which connects the short distance between the stacking bonding pad 212dsu3 and the control pin bonding pad 212dc.

The first, second, third and fourth semiconductor devices 210a, 210b, 210c and 210d have the bonding pad array in which at least one of the stacking bonding pads 212asu1, 212asu2, 212asu3, 212bsu1, 212bsu2, 212bsu3, 212csu1, 212csu2, 212csu3, 212dsu1, 212dsu2 and 212dsu3 is adjacent to the control pin bonding pads 212ac, 212bc, 212cc and 212dc. Therefore, unlike conventional methods, the physical length difference of the interconnections between the stacked first, second, third and fourth semiconductor devices 210a, 210b, 210c and 210d may be minimized. The interconnections are the paths that receive operation signals controlling operation of the stacked first, second, third and fourth semiconductor devices 210a, 210b, 210c and 210d. Therefore, the signal delay resulting from the signal time difference between the stacked first, second, third and fourth semiconductor devices 210a, 210b, 210c and 210d may be minimized.

Figure 4A:
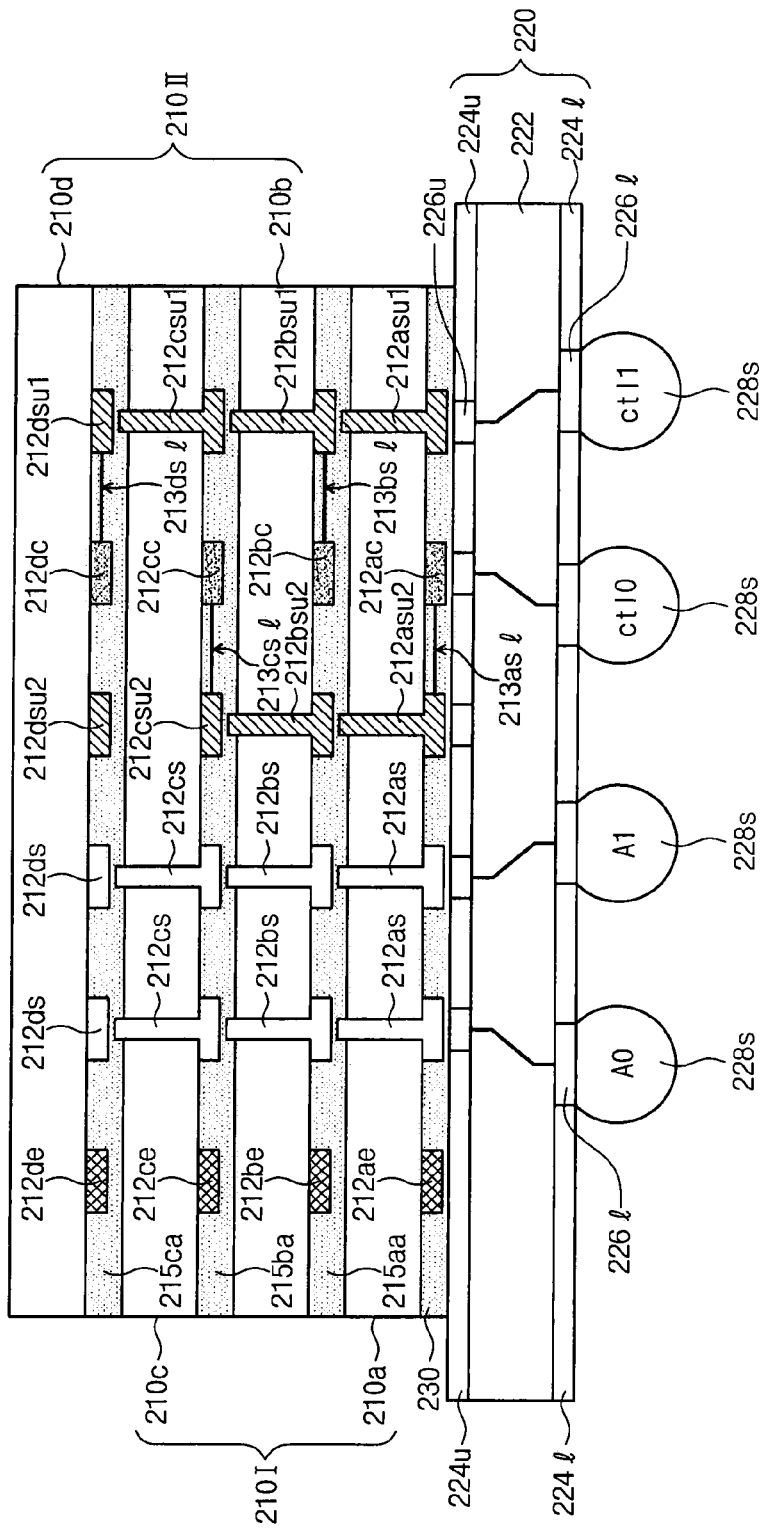
FIG. 4A and FIG. 4B are a sectional view and a top plan view of a semiconductor device package according to yet another exemplary embodiment of the present invention.
Figure 4B:
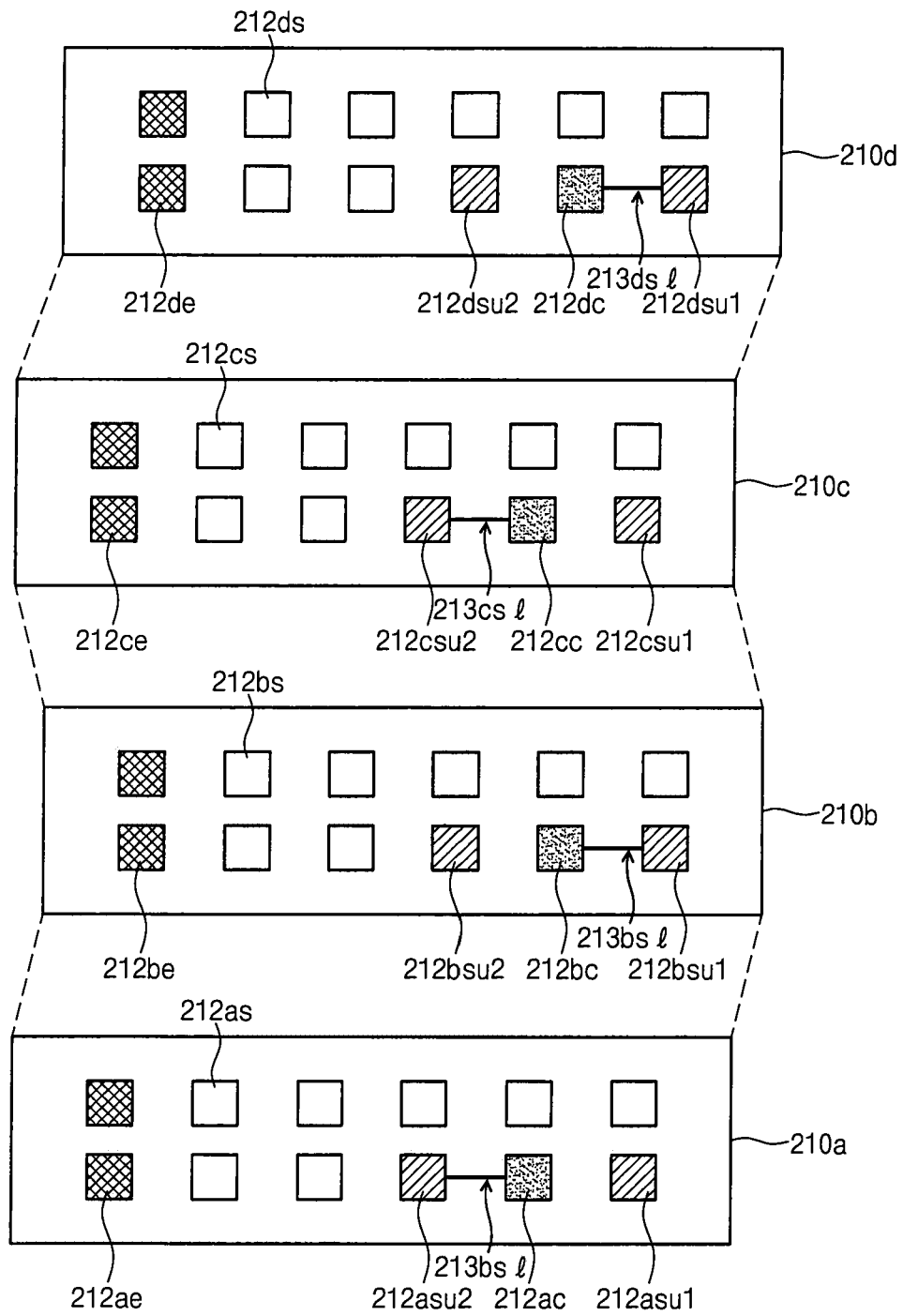

FIG. 4A and FIG. 4B are a sectional view and a top plan view of a semiconductor device package according to yet another exemplary embodiment of the present invention.

Referring to FIGS. 4A and 4B, a semiconductor device package may include stacked first, second, third and fourth semiconductor devices 210a, 210b, 210c and 210d and a wiring substrate 220. The first and third semiconductor devices 210a and 210c may constitute a first semiconductor device group 210I, and the second and fourth semiconductor devices 120b and 210d may constitute a second semiconductor device group 210 II. At least one of the semiconductor device groups 210I and/or 210 II may include at least two semiconductor devices. The first and second device groups 210I or 210 II may include at least one semiconductor device. The first and second semiconductor device groups 210I and 210 II may consist of the same semiconductor devices having the same bonding pad array so that the semiconductor devices of each of the first and second device groups 210I and 210 II operate by the same signal.

As shown in FIG. 4A, the semiconductor devices 210a, 210b, 210c and 210d of the first and second device groups 210I and 210 II may be stacked in an alternating pattern. Also, the semiconductor devices 210b and 210d of the second semiconductor device group 210 II may be interposed between the semiconductor devices 210a and 210c of the first device group 210I. In addition, a third semiconductor device group (not shown) may be further interposed between the semiconductor devices 210b and 210d of the second semiconductor device group 210 II.

The first, second, third and fourth semiconductor devices 210a, 210b, 201c and 210d may include on each of their respective active surfaces a control pin bonding pad 212ac, 212bc, 212cc and 212dc, at least one EDS bonding pad 212ae, 212be, 212ce and 212de, a plurality of signal bonding pads 212as, 212bs, 212cs and 212ds, and at least one stacking bonding pad 212asu1, 212asu2, 212bsu1, 212bsu2, 212csu1, 212csu2, 212dsu1 and 212dsu2. The first, second, third and fourth semiconductor devices 210a, 210b, 201c and 210d may have a bonding pad array in which at least one of the stacking bonding pads 212asu1, 212asu2, 212bsu1, 212bsu2, 212csu1, 212csu2, 212dsu1 and 112dsu2 is adjacent to the control pin bonding pads 212ac, 212bc, 212cc and 212dc.

The signal bonding pads 212as, 212bs, 212cs and 212ds may be arrayed in a plurality of rows, and the number of the EDS bonding pads 212ae, 212be, 212ce and 212de may be equal to the number of rows of the signal bonding pads 212as, 212bs, 212cs and 212ds. As there are two rows of the signal bonding pads 212as, 212bs, 212cs and 212ds shown in FIGS. 4A and 4B, there may be two EDS bonding pads 212ae, 212be, 212ce and 212d on each of the first, second, third and fourth semiconductor devices 210a, 210b, 201c and 210d. If m stacked semiconductor device groups are stacked (m is two or a larger positive integer), the number of the stacking bonding pads on each of the stacked semiconductor devices may be m. As there are two stacked semiconductor device groups 210I and 210 II shown in FIGS. 4A and 4B, the number of the stacking bonding pads 212asu1, 212asu2, 212bsu1, 212bsu2, 212csu1, 212csu2, 212dsu1 and 212dsu2 on each of the first, second, third and fourth semiconductor devices 210a, 210b, 201c and 210d may be two. The EDS bonding pads 212ae, 212be, 212ce and 212de may be used in place of the stacking bonding pads 212asu1, 212asu2, 212bsu1, 212bsu2, 212csu1, 212csu2, 212dsu1 and 212dsu2. In other words, by forming the EDS bonding pads 212ae, 212be, 212ce and 212de adjacent to the control pin bonding pads 212ac, 212bc, 212cc and 212dc, the EDS bonding pads 212ae, 121be, 212ce and 212de may serve as the stacking bonding pads 212asu1, 212asu2, 212bsu1, 212bsu2, 212csu1, 212csu2, 212dsu1 and 212dsu2.

Each of the bonding pads may be configured to be connected to penetrating electrodes penetrating the first, second, third and fourth semiconductor devices 210a, 210b, 210c and 210d. Each of the bonding pads and the penetrating electrodes connected to each of the bonding pads may be in a form such that they are not protruded from the surfaces of the first, second, third and fourth semiconductor devices 210a, 210b, 210c and 210d. The bonding pads not electrically connected between the stacked first, second, third and fourth semiconductor devices 210a, 210b, 210c and 210d, for example, the EDS bonding pads 212ae, 212be, 212ce and 212de or the control pin bonding pads 212ac, 212bc, 212cc and 212dc, may not be connected to the penetrating electrodes. As shown, in the case where there are four stacked semiconductor devices 210a, 210b, 210c and 210d, all of the bonding pads 212dc, 212de, 212ds, 212dsu1, 212dsu2 and 212dsu3 of the fourth semiconductor device 210d may be configured not to be connected to the penetrating electrodes.

The signal bonding pads 212as, 212bs, 212cs and 212ds and the stacking bonding pads 212asu1, 212asu2, 212bsu1, 212bsu2, 212csu1, 212csu2, 212dsu1 and 212dsu2 may be electrically connected respectively between the stacked first, second, third and fourth semiconductor devices 210a, 210b, 210c and 210d. The stacking bonding pad 212csu2 of the third semiconductor device 210c which is not electrically connected to the stacking bonding pad 212dsu2 of the fourth semiconductor device 210d may be configured not to be electrically connected to the penetrating electrode. Such electrical connections may be made by the adhesive material layers 215aa, 215ba and 215ca each provided between the first, second, third and fourth semiconductor devices 210a, 210b, 210c and 210d, respectively. The adhesive material layers 215aa, 215ba and 215ca may be made of an anisotropic conductive film (ACF). Alternatively, if the bonding pads and the penetrating electrodes connected to the bonding pads are not protruded from the surfaces of the first, second, third and fourth semiconductor devices 210a, 210b, 210c and 210d, such electrical connections may be made by connecting electrodes (similar to 216a, 216b and 216c of FIG. 3A) included in the adhesive material layers 215aa, 215ba and 125ca. The control pin bonding pads 212ac, 212bc, 212cc and 212dc and the EDS bonding pads 212ae, 212be, 212ce and 212de, disposed between the stacked first second, third and fourth semiconductor devices 210a, 210b, 210c and 210d, are not electrically connected to each other.

The wiring substrate 220 may include a system substrate such as a printed circuit board. The wiring substrate 220 having a core material 222 as the body, may have an upper surface insulation layer pattern 224u including upper bonding electrodes 226u and a lower surface insulation layer pattern 224l opposite of the upper surface insulation layer pattern 224u, the lower insulation layer pattern 224l including lower bonding electrodes 226l.

The wiring substrate 220 may have the upper bonding electrodes 226u corresponding to the bonding pads 212ac, 212as and 212asu1, 212asu2 and 212asu3, except for the EDS bonding pad 212ae of the first semiconductor device 210a. The upper bonding electrodes 226u may be electrically connected to their corresponding bonding pads 212ac, 212as and 212asu1, 212asu2 and 212asu3 of the first semiconductor device 210a. The stacked first, second, third and fourth semiconductor devices 210a, 210b, 210c and 210d may be mounted on the wiring substrate 220 with a mounting adhesive material layer (230). The mounting adhesive material layer 230 may be made of an anisotropic conductive film. Alternatively, the mounting adhesive material layer 230 may include the connecting electrodes (similar to 216a, 216b and 216c of FIG. 3A) provided for electrical connections between the stacked first, second, third and fourth semiconductor devices 210a, 210b, 210c and 210d, and the wiring substrate 220.

The wiring substrate 220 may have the lower bonding electrodes 226l for forming solder balls 228s on the lower surface. The solder balls 228s provided on the lower surface of the wiring substrate 220 are connected to the internal interconnections (bent solid lines) of the wiring substrate 220. These connections provide electrical connections of the first, second, third and fourth semiconductor devices 210a, 210b, 210c and 210d to external circuits. Signal solder balls A0 and A1 may be connected to the signal bonding pads 212as1 and 212as2 of the first semiconductor device 210a by the internal interconnections. Control solder balls ct10 and ct11 may be respectively connected to the control pin bonding pad 212ac and the stacking bonding pad 12asu1 of the first semiconductor device 210a by the internal interconnections of the wiring substrate 220.

The semiconductor device package including the stacked first, second, third and fourth semiconductor devices 210a, 210b, 210c and 210d may control each of the semiconductor device groups 210I and 210 II so as to selectively operate each of the semiconductor device groups 210I and 210 II. The first semiconductor device 210a of the first semiconductor device group 210I receives the operation signal indirectly by an additional connection line 213asl which connects the short distance between the stacking bonding pad 212asu2 adjacent to the control pin bonding pad 212ac. Further, the third semiconductor device 210c may receive the operation signal indirectly by another additional connection line 213csl which connects the short distance between the stacking bonding pad 212csu2 adjacent to the control pin bonding pad 212cc, the control pin bonding pad 212ac and the stacking bonding pad 212asu2 of the first semiconductor device 210a, and the stacking bonding pad 212bsu2 of the second semiconductor device 210b. The second semiconductor device 210b of the second semiconductor device group 210 II may receive the operation signal indirectly by an additional connection line 213bsl which connects the short distance between the stacking bonding pad 212bsu1 adjacent to the control pin bonding pad 212bc and the stacking bonding pad 212asu1 of the first semiconductor device 210a. Finally, the fourth semiconductor device 210d may also receive the operation signal indirectly by another additional connection line 213dsl which connects the short distance between the stacking bonding pad 212dsu1 adjacent to the control pin bonding pad 212dc, the stacking bonding pad 212asu1 of the first semiconductor device 210a, the stacking bonding pad 212bsu1 of the second semiconductor device 210b, and the stacking bonding pad 212csu1 of the third semiconductor device 210c.

The first, second, third and fourth semiconductor devices 210a, 210b, 210c and 210d have the bonding pad array in which at least one of the stacking bonding pads 212asu1, 212asu2, 212bsu1, 212bsu2, 212csu1, 212csu2, 212csu3, 212dsu1 and 212dsu2 is adjacent to the control pin bonding pads 212ac, 212bc, 212cc and 212dc. Therefore, unlike conventional methods, the physical length difference of the interconnections between the first and second semiconductor device groups 210I and 210 II may be minimized. The interconnections are used as the paths that receive operation signals controlling operations of the stacked first, second, third and fourth semiconductor devices 210a, 210b, 210c and 210d. Therefore, the signal delay resulting from the signal time difference between the first and second semiconductor device groups 210I and 210 II may be minimized.

FIG. 5 is a plan view of a bonding pad array of a semiconductor device according to an exemplary embodiment of the present invention.

Referring to FIG. 5, the semiconductor device 310 may have one row of bonding pads. The semiconductor device 310 may include one control pin bonding pad 312c, one EDS bonding pad 312e, a plurality of signal bonding pad 312s and three stacking bonding pads 312su1, 312su2 and 312su3 disposed on its active surface. The semiconductor device 310 may have a bonding pad array in which at least one of the stacking bonding pads 312su1, 312su2 and 312su3 is adjacent to the control pin bonding pad 312c. Accordingly, the signal delay resulting from the signal time difference between stacked semiconductor devices may be minimized.

As there is one row of the signal bonding pads 312s, there may be one EDS bonding pad 312e. As the number of the stacking bonding pads 312su1, 312su2 and 312su3 is three, there may be four stacked semiconductor substrates 310, or there may be three stacked semiconductor device groups.

FIGS. 6A to 6F are plan views of other bonding pad arrays of a semiconductor device according to exemplary embodiments of the present invention.

Referring to FIGS. 6A to 6F, the semiconductor device 410 may have various forms of bonding pad arrays having two rows. The semiconductor device 410 may include a control pin bonding pad 412c, two EDS bonding pads 412e, a plurality of signal bonding pads 412s and three stacking bonding pads 412su1, 412us2 and 412su3 on its active surface. The semiconductor device 410 may have a bonding pad array in which at least one of the stacking bonding pads 412su1, 412su2 and 412su3 is adjacent to the control pin bonding pad 412c. Accordingly, the signal delay resulting from signal time difference between stacked semiconductor devices may be minimized.

As there are two rows of the signal bonding pads 412s, there may be two EDS bonding pads 412e. As there are three stacking bonding pads 412su, there may be 4 stacked semiconductor devices 410, or there may be 3 stacked semiconductor device groups.

FIGS. 7A to 7C are plan views of yet other bonding pad arrays of a semiconductor device according to exemplary embodiments of the present invention.

Referring to FIGS. 7A to 7C, the semiconductor device 510 may have various forms of bonding pad arrays having three rows. The semiconductor device 510 may have a control pin bonding pad 512c, two or three EDS bonding pads 512e, a plurality of signal bonding pad 512s and two or three stacking bonding pads 512su1, 512su2 and 512su3 on its active surface. The semiconductor device 510 may have a bonding pad array in which at least one of the stacking bonding pads 512su1, 512su2 and 512su3 is adjacent to the control pin bonding pad 512c. Accordingly, the signal delay resulting from the signal time difference between stacked semiconductor devices may be minimized.

As there are two or three rows of the signal bonding pads 512s array, there may be two or three EDS bonding pads 512e. As there are two or three stacking bonding pads 512su, there may be three or four stacked semiconductor devices 510, or there may be two or three stacked semiconductor device groups.

By using a semiconductor device having a bonding pad array according to the exemplary embodiments of the present invention, the difference in signal time between stacked semiconductor devices included in a semiconductor device package may be minimized. Accordingly, the semiconductor device that can enhance the operation speed of the semiconductor device package may be provided.

Also, by using the semiconductor device having the bonding pad array according to the exemplary embodiments of the present invention, the difference in signal time between the stacked semiconductor devices included in the semiconductor device package may be minimized. Accordingly, a stacked structure of the semiconductor device that can enhance the operation speed of the semiconductor device package may be provided.

In addition, by using the semiconductor device having the bonding pad array according to the exemplary embodiments of the present invention, the difference in signal time between the stacked semiconductor devices included in the semiconductor device package may be minimized. Accordingly, the semiconductor device package with an enhanced operation speed may be provided.

In an exemplary embodiment of the present invention, a semiconductor device may include a bonding pad array comprising: a signal bonding pad provided on an active surface; a control pin bonding pad provided on the active surface; and at least one stacking bonding pad provided on the active surface, wherein the at least one stacking bonding pad is adjacent to the control pin bonding pad.

In another exemplary embodiment, a stacked structure of semiconductor devices may include a plurality of stacked semiconductor devices each comprising a bonding pad array including: a signal bonding pad; a control pin bonding pad; and n−1 stacking bonding pads provided on an active surface; wherein at least one of the n−1 stacking bonding pads is adjacent to the control pin bonding pad; and adhesive material layers provided between the stacked semiconductor devices, wherein the stacking bonding pads of the stacked semiconductor devices are electrically connected to each other in a stacked direction, and the control pin bonding pads of the stacked semiconductor devices is electrically connected to a stacking bonding pad selected from the n−1 stacking bonding pads.

In yet another exemplary embodiment, a stacked structure of semiconductor devices may include stacked semiconductor devices each comprising a bonding pad array including: a signal bonding pad; a control pin bonding pad; and m stacking bonding pads provided on an active surface, wherein at least one of the m stacking bonding pads is adjacent to the control pin bonding pad; and adhesive material layers provided between the stacked semiconductor devices, wherein the stacked semiconductor devices are classified into m semiconductor device groups (m being two or a larger positive integer), at least one of the m semiconductor device groups includes a plurality of semiconductor devices, the stacking bonding pads of the stacked semiconductor devices have at least one electrical connection in the stacked direction, and the control pin bonding pad of each of the semiconductor devices is electrically connected to a stacked bonding pad selected from the m stacking bonding pads.

In another exemplary embodiment a semiconductor device package may include stacked semiconductor devices, which have a stacked structure as described in either of the other exemplary embodiments; a wiring substrate having a first surface where the stacked semiconductor devices are mounted and a second surface opposite of the first surface; a mounting adhesive material layer interposed between the stacked semiconductor devices and the first surface of the wiring substrate; and signal solder balls and control solder balls provided on the second surface of the wiring substrate, wherein the signal solder balls are electrically connected to the signal bonding pads of a lowest semiconductor device of the stacked semiconductor devices, and the control solder balls are electrically connected to the control pin bonding pad and/or the stacking bonding pads of the lowest semiconductor device.

Although the present invention has been described in connection with the embodiments of the present invention illustrated in the accompanying drawings, it is not limited thereto. It will be apparent to those skilled in the art that various substitutions, modifications and changes may be made thereto without departing from the scope and spirit of the invention.

What is claimed is:

1. A stacked semiconductor device structure comprising:
   a wiring substrate including first and second control pins;
   a first semiconductor device on the wiring substrate, the first semiconductor device including:
      a first bonding pad array including:
         a first signal bonding pad disposed on an active surface;
         a first control pin bonding pad electrically coupled to the first control pin and disposed on the active surface;
         a first stacking bonding pad disposed on the active surface between the first signal bonding pad and the first control pin bonding pad and electrically coupled to the second control pin; and
         a first electrical die sorting bonding pad;
   a second semiconductor device on the first semiconductor device, the second semiconductor device including:
      a second bonding pad array including:
         a second signal bonding pad;
         a second control pin bonding pad;
         a second stacking bonding pad between the second signal bonding pad and the second control pin bonding pad and electrically coupled to and aligned with the first stacking bonding pad;
         a connection line that electrically couples the second stacking bonding pad and the second control pin bonding pad; and
         a second electrical die sorting bonding pad spaced apart from the first electrical die sorting pad, spaced apart from the connection line, and spaced apart from the first and second control pins.

2. The stacked semiconductor device structure of claim 1, wherein the first stacking bonding pad comprises n−1 stacking bonding pads when n semiconductor devices are stacked.

3. The stacked semiconductor device structure of claim 1, wherein the stacking bonding pad serves as an electrical die sorting bonding pad.

4. The stacked semiconductor device structure of claim 1, wherein the wiring substrate includes an adhesive material layer that extends contiguously along a surface of the first electrical die sorting pad.

5. The stacked semiconductor device structure of claim 4, wherein the first and second signal bonding pads are arrayed in a plurality of rows, and wherein a number of the first and second electrical die sorting bonding pads is equal to a number of the rows of the first and second signal bonding pads.

6. A stacked structure of semiconductor devices comprising:
   a plurality of stacked semiconductor devices, wherein a number of the stacked semiconductor devices is n, each of the stacked semiconductor devices comprising:
      a bonding pad array including:
         a signal bonding pad;
         a control pin bonding pad;
         an electrical die sorting pad; and
         n−1 stacking bonding pads on an active surface, wherein at least one of the n−1 stacking bonding pads is between the control pin bonding pad and the signal bonding pad, and wherein n is a positive integer of two or more; and
   adhesive material layers disposed between the stacked semiconductor devices,
   wherein the electrical die sorting pads of the stacked semiconductor devices are spaced apart from each other, spaced apart from the stacking bonding pads, and spaced apart from a connection line that electrically couples one of the stacking bonding pads to the control pin bonding pad,
   wherein the stacking bonding pads of the stacked semiconductor devices are electrically connected to each other in a stacked direction, and
   wherein the control pin bonding pad of each of the semiconductor devices is electrically connected to a stacking bonding pad selected from the n−1 stacking bonding pads.

7. The stacked structure of semiconductor devices of claim 6, wherein the signal bonding pads of the stacked semiconductor devices are electrically connected to each other in the stacked direction.

8. The stacked structure of semiconductor devices of claim 6, wherein the signal bonding pads are arrayed in a plurality of rows, and wherein a number of the electrical die sorting bonding pads is equal to a number of the rows of the signal bonding pads.

9. The stacked structure of semiconductor devices of claim 6, wherein the adhesive material layer between the semiconductor devices comprises an anisotropic conductive film.

10. The stacked structure of semiconductor devices of claim 6, wherein the adhesive material layer between the semiconductor devices comprises connecting electrodes for electrical connection between the stacked semiconductor devices.

11. The stacked structure of semiconductor devices of claim 6, further comprising:
   a wiring substrate having a first surface where the stacked semiconductor devices are mounted and a second surface opposite of the first surface;
   a mounting adhesive material layer interposed between the stacked semiconductor devices and the first surface of the wiring substrate; and
   signal solder balls and control solder balls disposed on the second surface of the wiring substrate, wherein the signal solder balls are electrically connected to the signal bonding pads of a lowest semiconductor device of the stacked semiconductor devices, and the control solder balls are electrically connected to at least one of the control pin bonding pad and the stacking bonding pads of the lowest semiconductor device.

12. The semiconductor device package of claim 11, wherein the mounting adhesive material layer comprises an anisotropic conductive film (ACF).

13. The stacked structure of semiconductor devices of claim 11, wherein the mounting adhesive material layer comprises bonding electrodes for electrical connection between the stacked semiconductor devices and the wiring substrate.

14. The stacked semiconductor device structure of claim 1, further comprising:
   bonding electrodes in the wiring substrate adjacent respective ones of the first signal bonding pad, the first control pin bonding pad, and the first stacking bonding pad.

15. The stacked semiconductor device structure of claim 2, wherein the second stacking bonding pad comprises n−1 stacking bonding pads when n semiconductor devices are stacked.

* * * * *